(12) United States Patent
Wang et al.

(10) Patent No.: US 12,025,870 B2
(45) Date of Patent: Jul. 2, 2024

(54) DISPLAY APPARATUS AND METHOD OF FABRICATING DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Chao Wang, Beijing (CN); Pan Zhao, Beijing (CN); Zhiliang Jiang, Beijing (CN); Fei Li, Beijing (CN); Dianjie Hou, Beijing (CN); Song Wang, Beijing (CN); Chang Liu, Beijing (CN); Qian Ma, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 317 days.

(21) Appl. No.: 17/436,055

(22) PCT Filed: Dec. 2, 2020

(86) PCT No.: PCT/CN2020/133274
§ 371 (c)(1),
(2) Date: Sep. 2, 2021

(87) PCT Pub. No.: WO2022/116030
PCT Pub. Date: Jun. 9, 2022

(65) Prior Publication Data
US 2022/0354004 A1 Nov. 3, 2022

(51) Int. Cl.
*G02F 1/1333* (2006.01)
*G02F 1/1345* (2006.01)
(Continued)

(52) U.S. Cl.
CPC ...... *G02F 1/133305* (2013.01); *G02F 1/1345* (2013.01); *G02F 1/13452* (2013.01);
(Continued)

(58) Field of Classification Search
None
See application file for complete search history.

(56) References Cited

U.S. PATENT DOCUMENTS 9,324,959 B2   4/2016  Namkung et al.
11,462,713 B2 * 10/2022 Kwon .............. G02F 1/133305
(Continued)

FOREIGN PATENT DOCUMENTS

CN   106887186 A   6/2017
CN   107942563 A   4/2018
(Continued)

OTHER PUBLICATIONS

International Search Report & Written Opinion mailed Sep. 1, 2021, regarding PCT/CN2020/133274.

*Primary Examiner* — Dung T Nguyen
(74) *Attorney, Agent, or Firm* — Intellectual Valley Law, P.C.

(57) ABSTRACT

A display apparatus is provided. The display apparatus includes a display panel having a display portion, a connecting portion, and a bending portion; a main support layer; and an auxiliary support layer including a main portion and a folded-back portion connected to the main portion as a unitary structure. An edge portion of the display apparatus includes a stacked structure. The stacked structure includes the connecting portion; the folded-back portion on the connecting portion; at least a part of the main portion on a side of the folded-back portion away from the connecting portion; a part of the main support layer; and a part of the display portion on a side of the part of the main support layer
(Continued)

away from the main portion. Layers of the stacked structure is curved toward a back side of the display apparatus.

17 Claims, 8 Drawing Sheets

(51) Int. Cl.
    *B32B 1/00*         (2006.01)
    *B32B 3/04*         (2006.01)
    *B32B 3/30*         (2006.01)
    *B32B 7/12*         (2006.01)
    *B32B 15/04*       (2006.01)
    *B32B 15/08*       (2006.01)
    *B32B 37/18*       (2006.01)
    *B32B 38/00*       (2006.01)
    *H05K 5/00*        (2006.01)

(52) U.S. Cl.
    CPC . *B32B 1/00* (2013.01); *B32B 3/04* (2013.01); *B32B 3/30* (2013.01); *B32B 7/12* (2013.01); *B32B 15/043* (2013.01); *B32B 15/08* (2013.01); *B32B 37/182* (2013.01); *B32B 38/0012* (2013.01); *B32B 2311/00* (2013.01); *B32B 2457/20* (2013.01); *H05K 5/0018* (2022.08)

(56) References Cited

U.S. PATENT DOCUMENTS

| | | |
|---|---|---|
| 2009/0021666 A1 | 1/2009 | Chen |
| 2016/0035759 A1 | 2/2016 | Kwon et al. |
| 2017/0179423 A1 | 6/2017 | Kwon et al. |
| 2020/0185641 A1 | 6/2020 | Jeong et al. |
| 2020/0264668 A1 | 8/2020 | Baek et al. |
| 2020/0363882 A1 | 11/2020 | Nam et al. |

FOREIGN PATENT DOCUMENTS

| | | |
|---|---|---|
| CN | 108389876 A | 8/2018 |
| CN | 108766247 A | 11/2018 |
| CN | 110445913 A | 11/2019 |
| CN | 110491288 A | 11/2019 |
| CN | 111562853 A | 8/2020 |
| CN | 111816082 A | 10/2020 |
| CN | 111933067 A | 11/2020 |

* cited by examiner

DISPLAY APPARATUS AND METHOD OF FABRICATING DISPLAY APPARATUS

CROSS-REFERENCE TO RELATED APPLICATION

This application is a national stage application under 35 U.S.C. § 371 of International Application No. PCT/CN2020/133274, filed Dec. 2, 2020, the contents of which are incorporated by reference in the entirety.

TECHNICAL FIELD

The present invention relates to display technology, more particularly, to a display apparatus and a method of fabricating a display apparatus.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides a display apparatus, comprising a display panel having a display portion, a connecting portion, and a bending portion, wherein the bending portion connects the display portion and the connecting portion, the bending portion is bent; a main support layer; and an auxiliary support layer comprising a main portion and a folded-back portion connected to the main portion as a unitary structure; wherein an edge portion of the display apparatus comprises a stacked structure, the stacked structure comprising the connecting portion; the folded-back portion on the connecting portion; at least a part of the main portion on a side of the folded-back portion away from the connecting portion; a part of the main support layer; and a part of the display portion on a side of the part of the main support layer away from the main portion; wherein layers of the stacked structure is curved toward a back side of the display apparatus, the back side of the display apparatus being opposite to a light emitting side of the display apparatus.

Optionally, the folded-back portion and the main portion comprise a same material: the folded-back portion and a portion of the main portion form a double layer structure; and the folded-back portion is at least partially in contact with a back surface of the main portion, the back surface being a surface of the main portion on a side away from the main support layer.

Optionally, the bending portion is bent to form a bending cavity; and a portion of the auxiliary support layer where the folded-back portion and the main portion connected to each other is directly adjacent to the bending cavity.

Optionally, at least portions of the folded-back portion and the main portion have matching curvatures.

Optionally, at least portions of the folded-back portion, the main portion, and the main support layer have matching curvatures.

Optionally, a respective layer of the layers of the stacked structure and an adjacent layer have matching curvatures.

Optionally, the display apparatus further comprises a flexible printed circuit bonded to the connecting portion; wherein the flexible printed circuit comprises a chip portion on a back side of the display apparatus, a bonding portion comprising a plurality of bonding pads that are bonded to the connecting portion, and an extension portion connecting the chip portion and the bonding portion; and a first average distance between a surface of the bonding portion on a side closer to the main support layer and a surface of the main support layer on a side closer to the bonding portion is substantially same as a second average distance between a surface of the extension portion on a side closer to the main support layer and a surface of the main support layer on a side closer to the extension portion.

Optionally, the surface of the bonding portion on a side closer to the main support layer and the surface of the extension portion on a side closer to the main support layer are substantially co-planar.

Optionally, an orthographic projection of an edge of the folded-back portion closer to the chip portion on the main support layer is spaced apart from an orthographic projection of an edge of the connecting portion closer to the chip portion on the main support layer by a distance equal to or greater than 0.2 mm; the orthographic projection of the edge of the connecting portion closer to the chip portion on the main support layer is spaced apart from an orthographic projection of an edge of the chip portion closer to the folded-back portion on the main support layer is spaced apart by a distance less than 1.0 mm; and the orthographic projection of the edge of the folded-back portion closer to the chip portion on the main support layer is between the orthographic projection of the edge of the connecting portion closer to the chip portion on the main support layer and the orthographic projection of the edge of the chip portion closer to the folded-back portion on the main support layer.

Optionally, the stacked structure further comprises a first back film covering aback surface of the display portion, the first back film being between the display portion and the part of the main support layer; and a second back film covering a back surface of the connecting portion, the second back film being between the connecting portion and the folded-back portion; wherein the bending portion is absent of the first back film and absent of the second back film.

Optionally, an orthographic projection of the folded-back portion on the second back film is non-overlapping with a portion of the second back film that extends toward the bending portion beyond a portion of the auxiliary support layer where the folded-back portion and the main portion connected to each other; and an edge of the portion of the second back film is spaced apart from the portion of the auxiliary support layer where the folded-back portion and the main portion connected to each other by a distance equal to or greater than 0.15 mm.

Optionally, the stacked structure further comprises a first optically clear adhesive layer between the first back film and the part of the main support layer, the first optically clear adhesive layer adhering the first back film and the main support layer together; a polarizer on a side of the display portion away from the first back film; a second optically clear adhesive layer on a side of the polarizer away from the display portion; and a cover on a side of the second optically clear adhesive layer away from the polarizer.

Optionally, the display apparatus further comprises a coating layer covering a back side of the bending portion opposite to a side directly surrounding the bending cavity.

Optionally, the main support layer comprises a metallic material; and the auxiliary support layer comprises an organic polymer material.

Optionally, the main support layer comprises a metallic material; and the auxiliary support layer comprises a metallic material.

In another aspect, the present disclosure provides a method of fabricating a display apparatus, comprising providing a display panel; bending the display panel thereby forming a bending portion, a display portion, and a connecting portion, the bending portion connecting the display portion and the connecting portion; providing a main support layer; providing an auxiliary support layer comprising a main portion and a folded-back portion connected to the main portion as a unitary structure; disposing the main support layer and the auxiliary support layer between the connecting portion and the display portion, thereby forming a stacked structure in an edge portion of the display apparatus, wherein the stacked structure comprising the connecting portion; the folded-back portion on the connecting portion; at least a part of the main portion on a side of the folded-back portion away from the connecting portion; the main support layer on a side of the main portion away from the folded-back portion; and a part of the display portion on a side of the main support layer away from the main portion; and curving layers of the stacked structure toward a back side of the display apparatus, the back side of the display apparatus being opposite to a light emitting side of the display apparatus.

Optionally, the method further comprises providing a proto-support layer; folding the proto-support layer to form the folded-back portion and the main portion, the folded-back portion and a portion of the main portion forming a double layer structure; and pressing at least the double layer structure to achieve a curvature matching with a curvature of the main support layer.

Optionally, curving the layers of the stacked structure comprises pressing the edge portion of the display apparatus using a profile indenter.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display apparatus and a method of fabricating a display apparatus that substantially obviate one or more of the problems due to limitations and disadvantages of the related art. In one aspect, the present disclosure provides a display apparatus. In some embodiments, the display apparatus includes a display panel having a display portion, a connecting portion, and a bending portion, wherein the bending portion connects the display portion and the connecting portion; a main support layer, and an auxiliary support layer comprising a main portion and a folded-back portion connected to the main portion as a unitary structure. Optionally, an edge portion of the display apparatus comprises a stacked structure, the stacked structure including the connecting portion; the folded-back portion on the connecting portion; a part of the main portion on a side of the folded-back portion away from the connecting portion; and the display portion on a side of the part of the main portion away from the folded-back portion. Optionally, layers of the stacked structure is curved toward a back side of the display portion, the back side of the display portion facing the connecting portion.

Figure 1A:
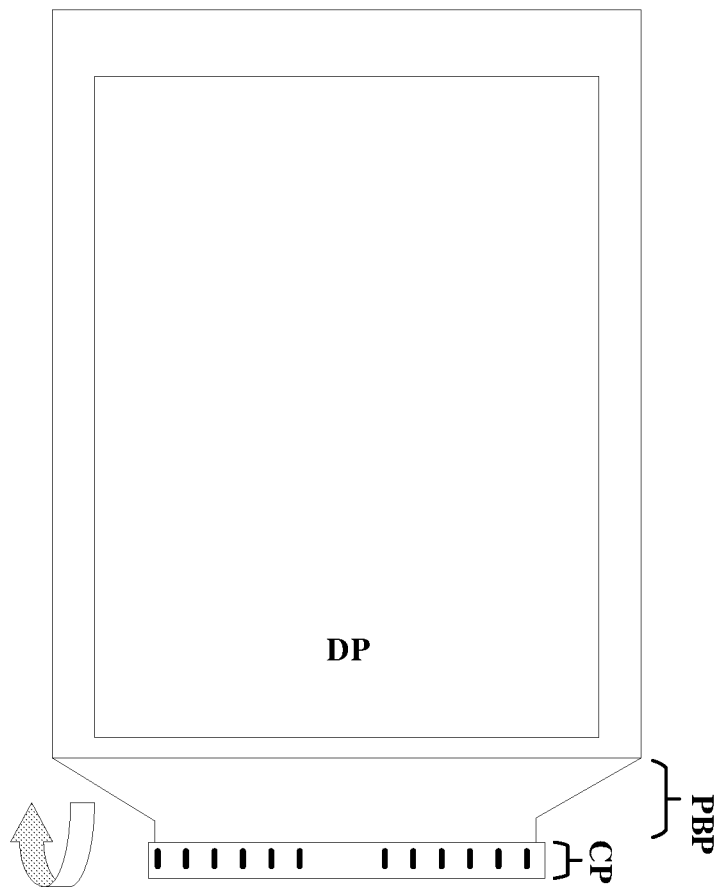
FIG. 1A is a schematic diagram of a display apparatus in some embodiments according to the present disclosure.

FIG. 1A is a schematic diagram of a display apparatus in some embodiments according to the present disclosure. Referring to FIG. 1A, the display apparatus includes a display panel having a display portion DP in at least a portion of which an image is displayed by an array of subpixels in the display portion. The display portion DP itself may includes a display region and a peripheral region surrounding the display region. Although a rectangular display region is shown in FIG. 1A, the display portion DP may have any appropriate shapes and dimensions. Examples of appropriate shapes of the display portion DP include a circular shape, a square shape, a hexagonal shape, an elliptical shape, and an irregular polygon shape. Each subpixel in the display portion DP may be electrically connected to a pixel driving circuit, which includes one or more thin film transistors. The display apparatus further includes gate lines and data lines for providing signals for driving image display in the display portion DP. These signal lines are electrically connected to one or more integrated circuits such as gate driving integrated circuit and data driving integrated circuit. The one or more integrated circuits may be integrated into the display panel (chip-on-glass) or mounted on a flexible printed circuit (chip-on-film). The one or more integrated circuits are electrically connected to the flexible printed circuit. The display apparatus further includes various other signal lines such as a high voltage supply line VDD, a low voltage supply line VSS, and an initiation signal line.

Figure 1B:
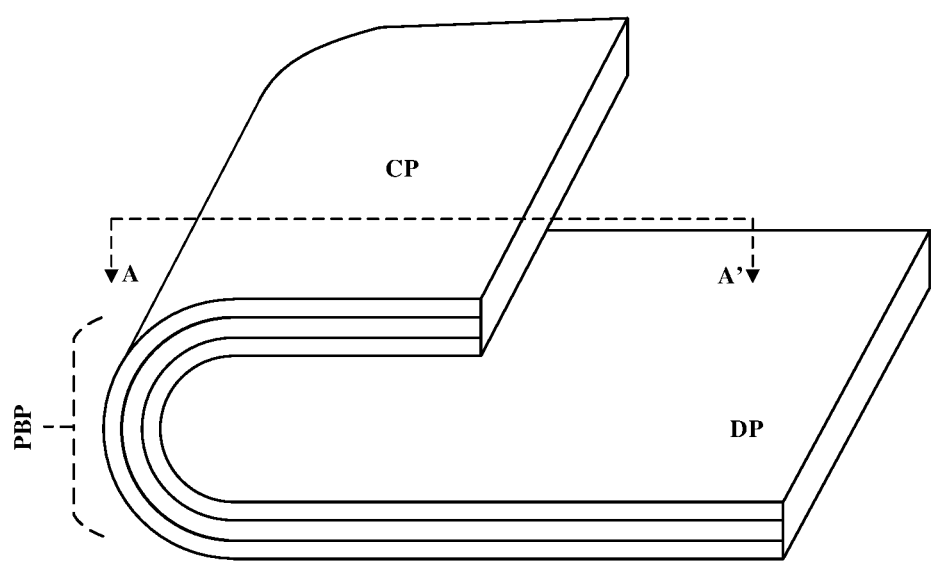
FIG. 1B is a schematic diagram of a display apparatus in some embodiments according to the present disclosure.

The display apparatus further includes a bending portion PBP and a connecting portion CP. The connecting portion CP is a portion where a flexible printed circuit can be bonded to the display apparatus. The bending portion PBP is flexible or bendable. As shown in FIG. 1A, the bending portion PBP may be bent along the direction of an arrow depicted in FIG. 1 so that the connecting portion CP can be bent toward a back side of the display portion. FIG. 1B is a schematic diagram of a display apparatus in some embodiments according to the present disclosure. FIG. 1B depicts a display apparatus in which the bending portion PBP is bent, and the connecting portion CP is bent toward the back side of the display portion. Optionally, the connecting portion CP is capable of displaying an image. Optionally, the bending portion BP is capable of displaying an image.

Figure 1C:
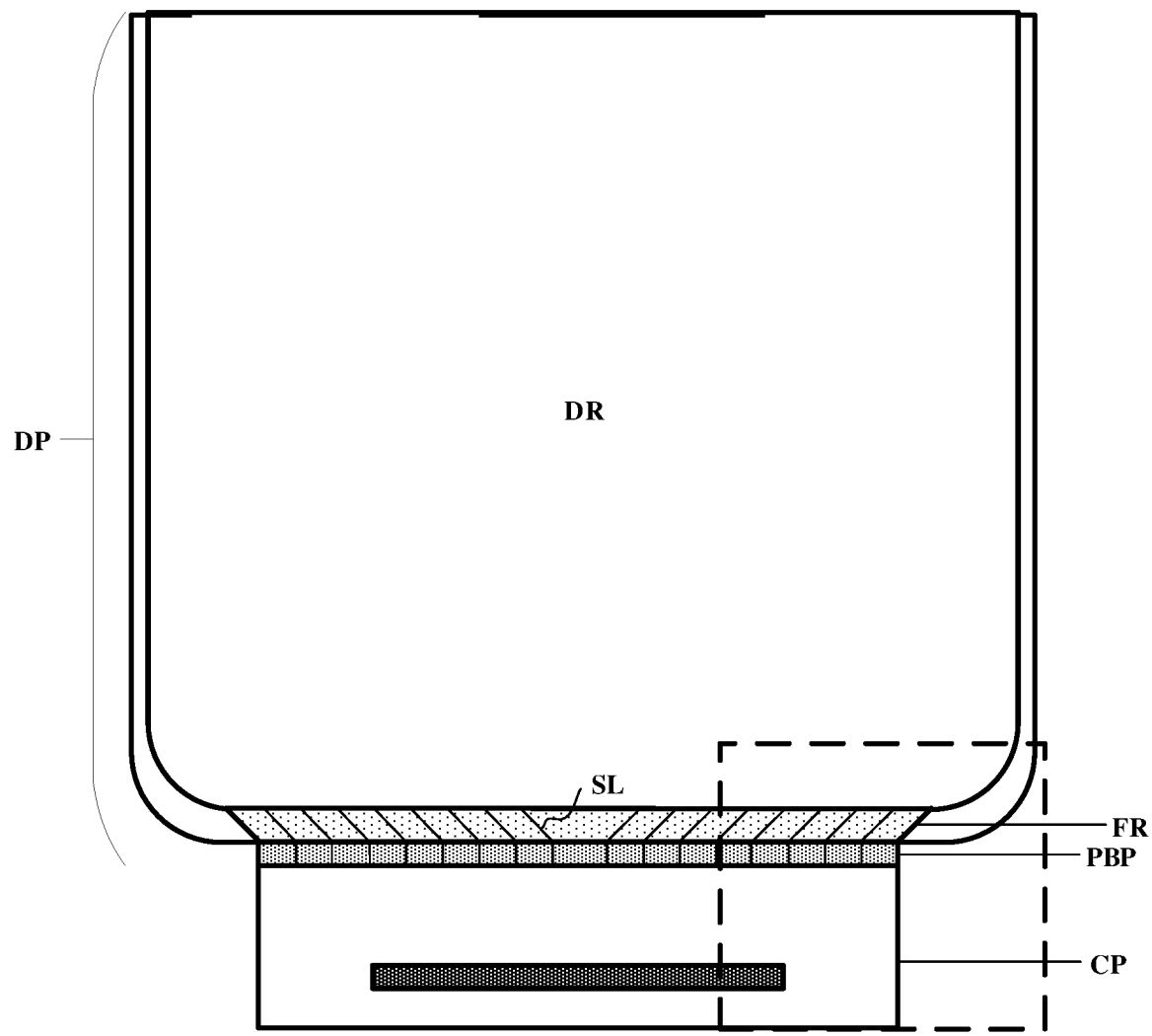
FIG. 1C is a plan view of a display apparatus in some embodiments according to the present disclosure.

FIG. 1C is a plan view of a display apparatus in some embodiments according to the present disclosure. Referring to FIG. 1C, the display portion DP in some embodiments includes a display region DR in which an image is displayed and a fanout region FR between the display region DR and the bending portion PBP. The display portion DP includes a plurality of signal lines SL extending through the fanout region FR.

As used herein, the term "display region" refers to a region of a display panel in a display apparatus where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the display apparatus is a flexible display apparatus.

Figure 2:
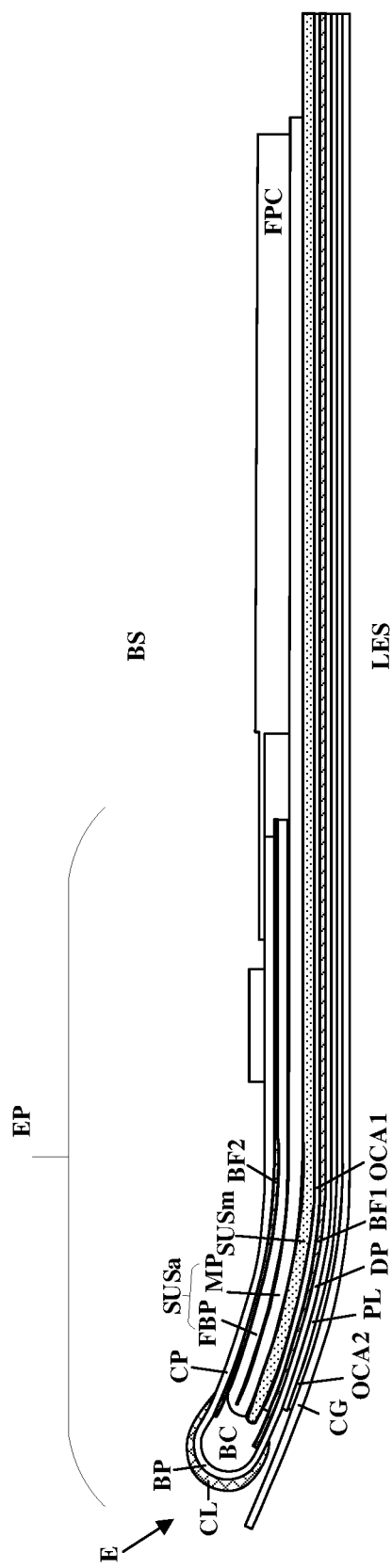
FIG. 2 is a partial cross-sectional view of a display apparatus in some embodiments according to the present disclosure.

FIG. 2 is a partial cross-sectional view of a display apparatus in some embodiments according to the present disclosure. In one example, FIG. 2 is a partial cross-sectional view along an A-A' line of the display apparatus in FIG. 1B. Referring to FIG. 2, the display apparatus in some embodiments includes a display panel. In some embodiments, as shown in FIG. 2, the display panel includes a display portion DP, a connecting portion CP, and a bending portion BP. The bending portion BP connects the display portion DP and the connecting portion CP. The bending portion is bent along an edge E of the display apparatus. As shown in FIG. 2, the bending portion BP is bent to form a bending cavity BC.

In some embodiments, the display apparatus further includes a main support layer SUSm and an auxiliary support layer SUSa. The main support layer SUSm and the auxiliary support layer SUSa are between the connecting portion CP and the display portion DP. In some embodiments, a stacked structure is formed in at least an edge portion EP of the display apparatus. The stacked structure includes the connecting portion CP; the auxiliary support layer SUSa on the connecting portion CP; a part of the main support layer SUSm; and a part of the display portion DP on a side of the part of the main support layer SUSm away from the auxiliary support layer SUSa.

The inventors of the present disclosure discover that, surprisingly and unexpectedly, a stacked structure with an intricate structure described in this disclosure can achieve a display apparatus that obviates many issues including deformation and crack open in the edge portion, and peeling of a flexible printed circuit. The display apparatus with the present stacked structure achieves a unusually high adhesive strength among the layers in the edge portion, the display apparatus in the edge portion is much less prone to deformation during the pad bending process, and the flexible printed circuit can be securely attached to the connecting portion for an elongated period of time.

In some embodiments, the auxiliary support layer SUSa has a unique structure including a main portion MP and a folded-back portion FBP connected to the main portion MP as a unitary structure. The folded-back portion FBP is folded onto a back side of the main portion MP, forming a double layer structure. Accordingly, the stacked structure in some embodiments includes the connecting portion CP; the folded-back portion FBP on the connecting portion CP; at least a part of the main portion MP on a side of the folded-back portion FBP away from the connecting portion CP; a part of the main support layer SUSm on a side of the main portion MP away from the folded-back portion FBP; and a part of the display portion DP on a side of the part of the main support layer SUSm away from the main portion MP.

Figure 3:
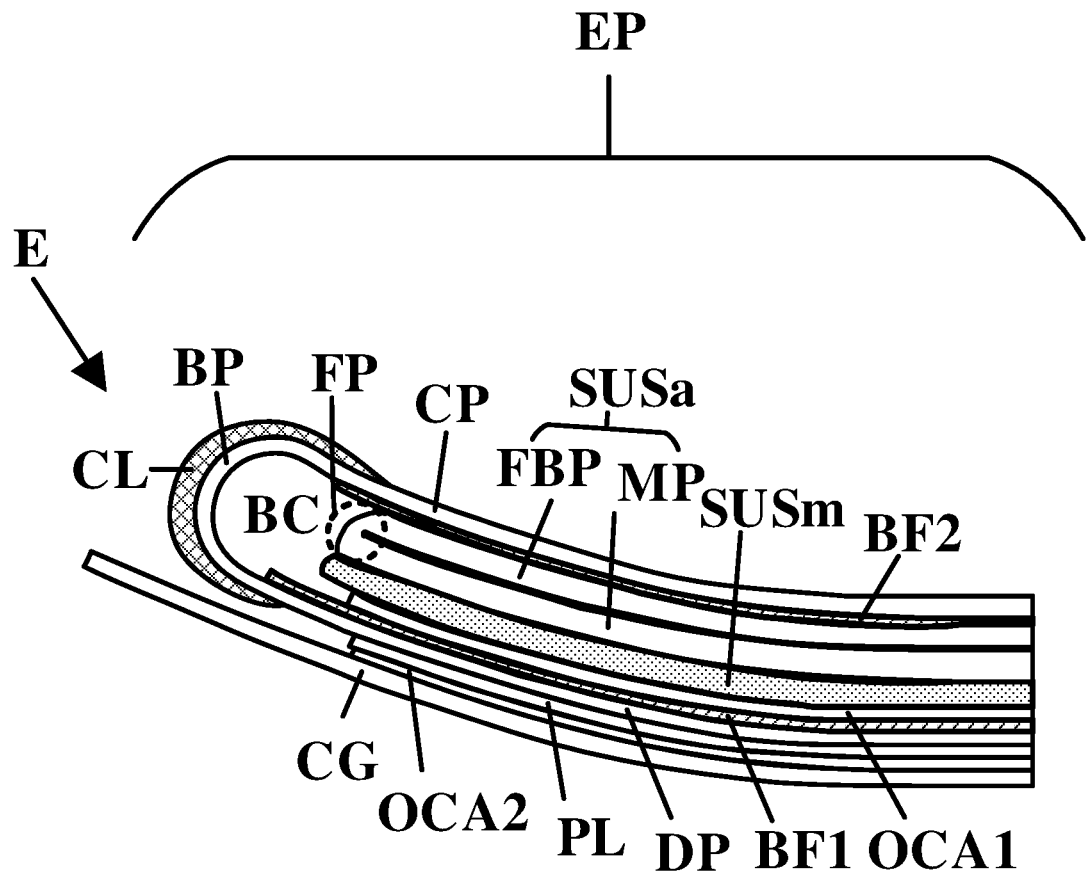
FIG. 3 is a further zoom-in view of a stacked structure in some embodiments according to the present disclosure.

FIG. 3 is a further zoom-in view of a stacked structure in some embodiments according to the present disclosure. Referring to FIG. 3, the folded-back portion FBP is at least partially in contact with a back surface of the main portion MP, the back surface being a surface of the main portion MP on a side away from the main support layer SUSm. The inventors of the present disclosure discover that the stacked structure is particularly resistant to crack open and deformation when the folded-back portion FBP and the main portion MP are formed as a unitary structure. For example, the folded-back portion FBP and the main portion MP in some embodiments are made by folding a proto-support layer. Along the folding line the proto-support layer is folded thereby forming the folded-back portion FBP and the main portion MP. The folded-back portion FBP is folded onto the back side of the main portion MP, as discussed above. Accordingly, in some embodiments, the folded-back portion FBP and the main portion MP are made of a same material. FIG. 3 shows a portion FP of the auxiliary support layer SUSa where the folded-back portion FBP and the main portion MP connected to each other. As shown in FIG. 3, the portion FP is directly adjacent to the bending cavity BC.

Optionally, the portion FP a portion connecting the folded-back portion FBP and the main portion MP is formed in the process when the folded-back portion FBP is folded onto the back side of the main portion MP. Accordingly, the portion FP may be considered as a lateral side of the auxiliary support layer SUSa directly adjacent to the bending cavity BC. Optionally, a thickness of the portion FP is a sum of a thickness of the main portion MP and a thickness of the folded-back portion FBP. Optionally, each of the thickness of the main portion MP and the thickness of the folded-back portion FBP is in a range of 0.05 mm to 0.25 mm, e.g., 0.05 mm to 0.10 mm, 0.10 mm to 0.15 mm, 0.15 mm to 0.20 mm, or 0.20 mm to 0.25 mm. In one example, each of the thickness of the main portion MP and the thickness of the folded-back portion FBP is 0.15 mm.

In some embodiments, layers of the stacked structure is curved toward a back side BS of the display portion. Optionally, the back side BS of the display apparatus is opposite to a light emitting side LES of the display apparatus where the display apparatus is configured to emitting light for image display. As used herein, the term "curved" or "curving" refers to results of an action having, or an action resulting in, a deviation from a reference plane (e.g., a plane containing an unbend portion of the display apparatus) by an angle equal to or less than 45 degrees but greater than 1 degree, e.g., equal to or less than 40 degrees, equal to or less than 35 degrees, equal to or less than 30 degrees, equal to or less than 25 degrees, equal to or less than 20 degrees, equal to or less than 15 degrees, equal to or less than 10 degrees, or equal to or less than 5 degrees. As used herein, the term "bent" or "bending" refers to results of an action having, or an action resulting in, a deviation from a reference plane by an angle equal to or greater than 90 degrees, e.g., equal to or greater than 100 degrees, equal to or greater than 110 degrees, equal to or greater than 120 degrees, equal to or greater than 130 degrees, equal to or greater than 140 degrees, equal to or greater than 150 degrees, equal to or greater than 160 degrees, equal to or greater than 170 degrees, equal to or greater than 175 degrees, equal to or greater than 179 degrees, or 180 degrees.

In some embodiments, at least portions of the folded-back portion FBP and the main portion MP have a matching curvature. As used herein, the term "curvature" refers to a rate of angular change of a curved object or a curved line segment. As used herein, the term "matching" curvatures refers to two curved objects have matching rates of angular change along at least portions of the two curved objects adjacent to each other. In one example, two curved objects have matching curvatures such that adjacent surfaces of the two curved objects are substantially exact counterparts of each other, for example, complementary to each other.

In some embodiments, at least portions of the folded-back portion FBP, the main portion MP, and the main support layer SUSm have matching curvatures. In one example, the portions of the folded-back portion FBP, the main portion MP, and the main support layer SUSm are subject to an action of pressing by, e.g., a profile indenter having a surface with a desired curvature.

In some embodiments, a respective layer of the layers of the stacked structure and an adjacent layer have matching curvatures. In one example, as shown in FIG. 2, the stacked structure includes the display portion DP, a first back film BF1 on the display portion DP, a first optically clear adhesive layer OCA1 on a side of the first back film BF1 away from the display portion DP, a part of the main support layer SUSm on a side of the first optically clear adhesive layer OCA1 away from the first back film BF1, the main portion MP on a side of the part of the main support layer SUSm away from the first optically clear adhesive layer OCA1, the folded-back portion FBP on a side of the main portion MP away from the main support layer SUSm, a second back film BF2 on a side of the folded-back portion FBP away from the main portion MP, and the connecting portion CP on a side of the second back film BF2 away from the folded-back portion FBP. In one example, the first optically clear adhesive layer OCA1, the main support layer SUSm, and the first back film BF1 have matching curvatures. In another example, the second back film BF2, the connecting portion CP, and the folded-back portion FBP have matching curvatures.

Figure 4:
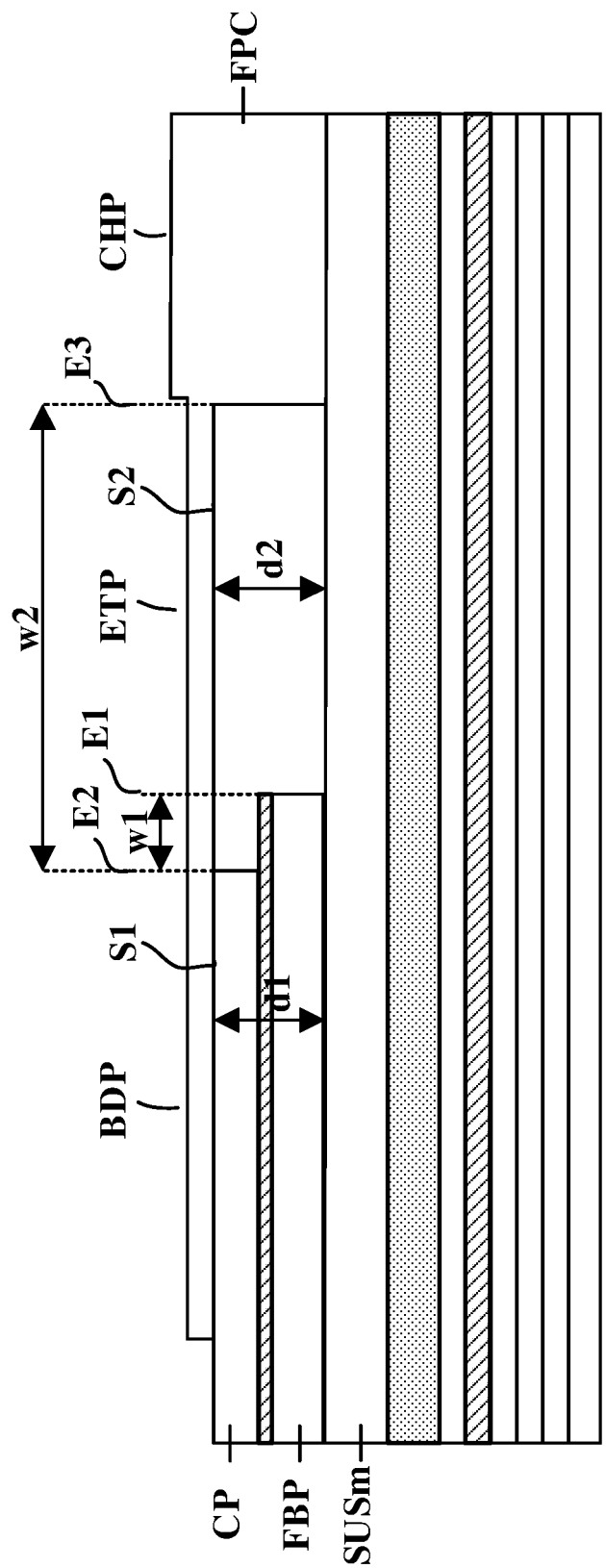
FIG. 4 is a further zoom-in view of a region surrounding a bonding region where a flexible printed circuit binds to a connecting portion of the display apparatus in some embodiments according to the present disclosure.

In some embodiments, the display apparatus further includes a flexible printed circuit FPC bonded to the connecting portion CP. FIG. 4 is a further zoom-in view of a region surrounding a bonding region where a flexible printed circuit binds to a connecting portion of the display apparatus in some embodiments according to the present disclosure. Referring to FIG. 4, in some embodiment, the flexible printed circuit FPC includes a chip portion CHP on a back side of the display apparatus, a bonding portion BDP having a plurality of bonding pads that are bonded to the connecting portion CP, and an extension portion ETP connecting the chip portion CHP and the bonding portion BDP. The bonding portion BDP is in contact with the connecting portion CP, while the extension portion ETP is not in contact with the connecting portion CP. Optionally, the chip portion CHP is in contact with the main support layer SUSm or a layer on top of the main support layer SUSm, while the extension portion ETP is not in contact with the main support layer SUSm or a layer on top of the main support layer SUSm.

In the present display apparatus, due to the intricate structure of the stacked structure in the edge portion, the bonding portion BDP and the extension portion ETP can be formed substantially flat and substantially without segmental difference. In some embodiments, a first average distance d1 between a surface S1 of the bonding portion BDP on a side closer to the main support layer SUSm and a surface of the main support layer SUSm on a side closer to the bonding portion BDP is substantially same as a second average distance d2 between a surface S2 of the extension portion ETP on a side closer to the main support layer SUSm and a surface of the main support layer SUSm on a side closer to the extension portion ETP. In some embodiments, the surface S1 of the bonding portion BDP on a side closer to the main support layer SUSm and the surface S2 of the extension portion ETP on a side closer to the main support layer SUSm are substantially co-planar. As used herein, the term "substantially co-planar" refers to two or more surfaces on a structure sharing a same common plane or being offset no more than 0.05 mm (e.g., no more than 0.04 mm, no more than 0.03 mm, no more than 0.02 mm, no more than 0.01 mm, no more than 0.005 mm, or no more than 0.001 mm) from sharing the same common plane.

Figure 5:
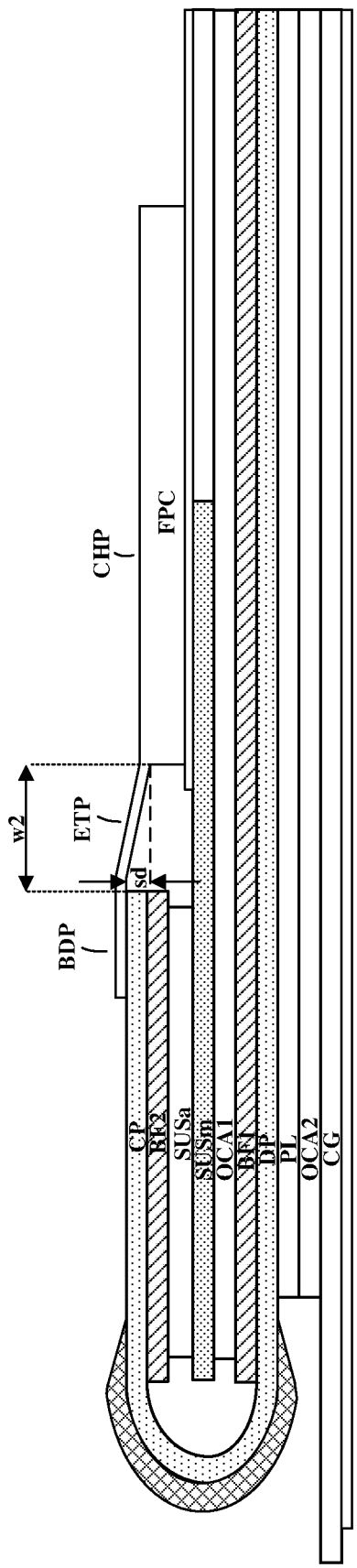
FIG. 5 is a partial cross-sectional view of a display apparatus in some embodiments according to the present disclosure.

FIG. 5 is a partial cross-sectional view of a display apparatus in some embodiments according to the present disclosure. Referring to FIG. 5, the display apparatus includes an auxiliary support layer SUSa that has a single layer structure, e.g., lacking a double layer structure formed by folding. The inventors of the present disclosure discover that the display apparatus in FIG. 5 results in a large segmental difference sd between the bonding portion BDP and the extension portion ETP. Typically, the segmental difference sd in the display apparatus is greater than 0.15 mm. The presence of the large segmental difference sd between the bonding portion BDP and the extension portion ETP renders the flexible printed circuit FPC prone to peeling defects. In order to make the display apparatus less prone to peeling defect, typically the chip portion CHP has to be spaced apart from the connecting portion CP by a large distance w2. Typically, the chip portion CHP has to be spaced apart from the connecting portion CP by a distance w2 of at least 10 times of the segmental difference sd (e.g., 1.5 mm) to reduce the peeling defect.

Referring to FIG. 2 and FIG. 4 again, by having a unique stacked structure as described in the present disclosure, the bonding portion BDP and the extension portion ETP can be formed substantially flat and substantially without segmental difference, as discussed above. By having the bonding portion BDP and the extension portion ETP substantially flat and substantially without segmental difference, the chip portion CHP does not have to spaced apart from the connecting portion CP by a large distance as that in FIG. 5. In some embodiments, the orthographic projection of the edge E2 of the connecting portion CP closer to the chip portion CHP on the main support layer SUSm is spaced apart from an orthographic projection of an edge E3 of the chip portion CHP closer to the folded-back portion FBP on the main support layer SUSm is spaced apart by a distance w2 less than 1.2 mm, e.g., less than 1.1 mm, less than 1.0 mm, less than 0.9 mm, or less than 0.8 mm. Optionally, the distance w2 is 0.7 mm. The orthographic projection of the edge E1 of the folded-back portion FBP closer to the chip portion CHP on the main support layer SUSm is between the orthographic projection of the edge E2 of the connecting portion CP closer to the chip portion CHP on the main support layer SUSm and the orthographic projection of the edge E3 of the chip portion CHP closer to the folded-back portion FBP on the main support layer SUSm.

In some embodiments, an orthographic projection of an edge E1 of the folded-back portion FBP closer to the chip portion CHP on the main support layer SUSm is spaced apart from an orthographic projection of an edge E2 of the connecting portion CP closer to the chip portion CHP on the main support layer SUSm by a distance w1 equal to or greater than 0.2 mm. The orthographic projection of the edge E1 of the folded-back portion FBP closer to the chip portion CHP on the main support layer SUSm is between the orthographic projection of the edge E2 of the connecting portion CP closer to the chip portion CHP on the main support layer SUSm and the orthographic projection of the edge E3 of the chip portion CHP closer to the folded-back portion FBP on the main support layer SUSm. By having a spaced apart distance w1 equal to or greater than 0.2 mm, it can be ensured that the bonding region is substantially flat.

In some embodiments, referring to FIG. 2 and FIG. 3, the stacked structure further includes a first back film BF1 covering a back surface of the display portion DP, the first back film BD1 being between the display portion DP and the part of the main support layer SUSm; and a second back film BF2 covering a back surface of the connecting portion CP, the second back film BF2 being between the connecting portion CP and the folded-back portion FBP. The bending portion BP is absent of the first back film BF1 and absent of the second back film BF2.

Figure 6:
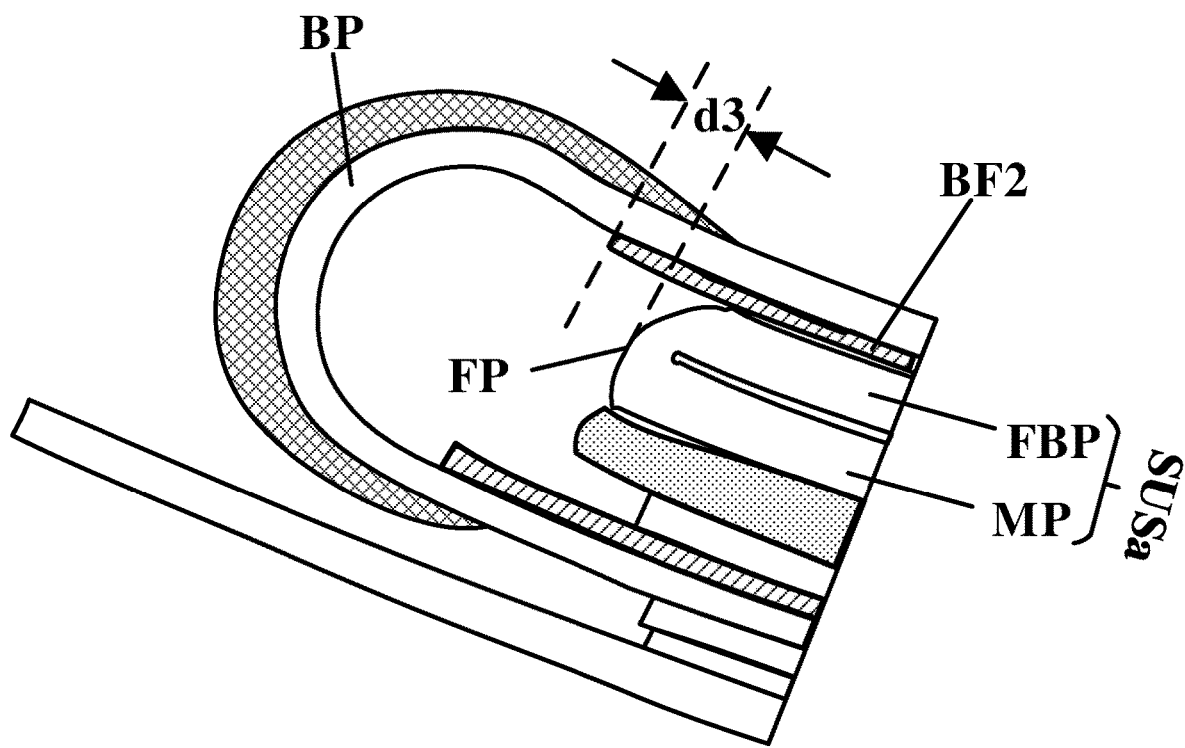
FIG. 6 is a further zoom-in view of a stacked structure in some embodiments according to the present disclosure.

FIG. 6 is a further zoom-in view of a stacked structure in some embodiments according to the present disclosure. Referring to FIG. 6, an orthographic projection of the folded-back portion FBP on the second back film BF2 is non-overlapping with a portion FP of the second back film BF2 that extends toward the bending portion BP beyond a portion of the auxiliary support layer SUSa where the folded-back portion FBP and the main portion MP connected to each other. Optionally, an edge of the portion FP of the second back film BF2 is spaced apart from the portion of the auxiliary support layer SUSa where the folded-back portion FBP and the main portion MP connected to each other by a distance d3 equal to or greater than 0.15 mm. By having this spaced apart distance, the second back film BF2 can be made more resistant to strain and stress caused by the bending.

Referring to FIG. 2 again, in some embodiments, the stacked structure further includes a first optically clear adhesive layer OCA1 between the first back film BF1 and the main support layer SUSm, the first optically clear adhesive layer OCA1 adhering the first back film BF1 and the main support layer SUSm together; a polarizer PL on a side of the display portion DP away from the first back film BF1; a second optically clear adhesive layer OCA2 on a side of the polarizer PL away from the display portion DP; and a cover CG on a side of the second optically clear adhesive layer OCA2 away from the polarizer PL.

In some embodiments, the display apparatus further includes a coating layer CL covering a back side of the bending portion BP opposite to a side directly surrounding the bending cavity BC.

In another aspect, the present disclosure provides a method of fabricating a display apparatus. In some embodiments, the method includes providing a display panel; bending the display panel thereby forming a bending portion, a display portion, and a connecting portion, the bending portion connecting the display portion and the connecting portion; providing a main support layer; providing an auxiliary support layer comprising a main portion and a folded-back portion connected to the main portion as a unitary structure; disposing the main support layer and the auxiliary support layer between the connecting portion and the display portion, thereby forming a stacked structure in an edge portion of the display apparatus, wherein the stacked structure comprising the connecting portion; the folded-back portion on the connecting portion; at least a part of the main portion on a side of the folded-back portion away from the connecting portion; a part of the main support layer on a side of the main portion away from the folded-back portion; and a part of the display portion on a side of the part of the main support layer away from the main portion; and curving the layers of the stacked structure toward a back side of the display apparatus, the back side of the display apparatus being opposite to a light emitting side of the display apparatus.

In some embodiments, the method further includes providing a proto-support layer; folding the proto-support layer to form the folded-back portion and the main portion, the folded-back portion and a portion of the main portion forming a double layer structure; and pressing at least the double layer structure to achieve a curvature matching with a curvature of the main support layer.

Figure 7:
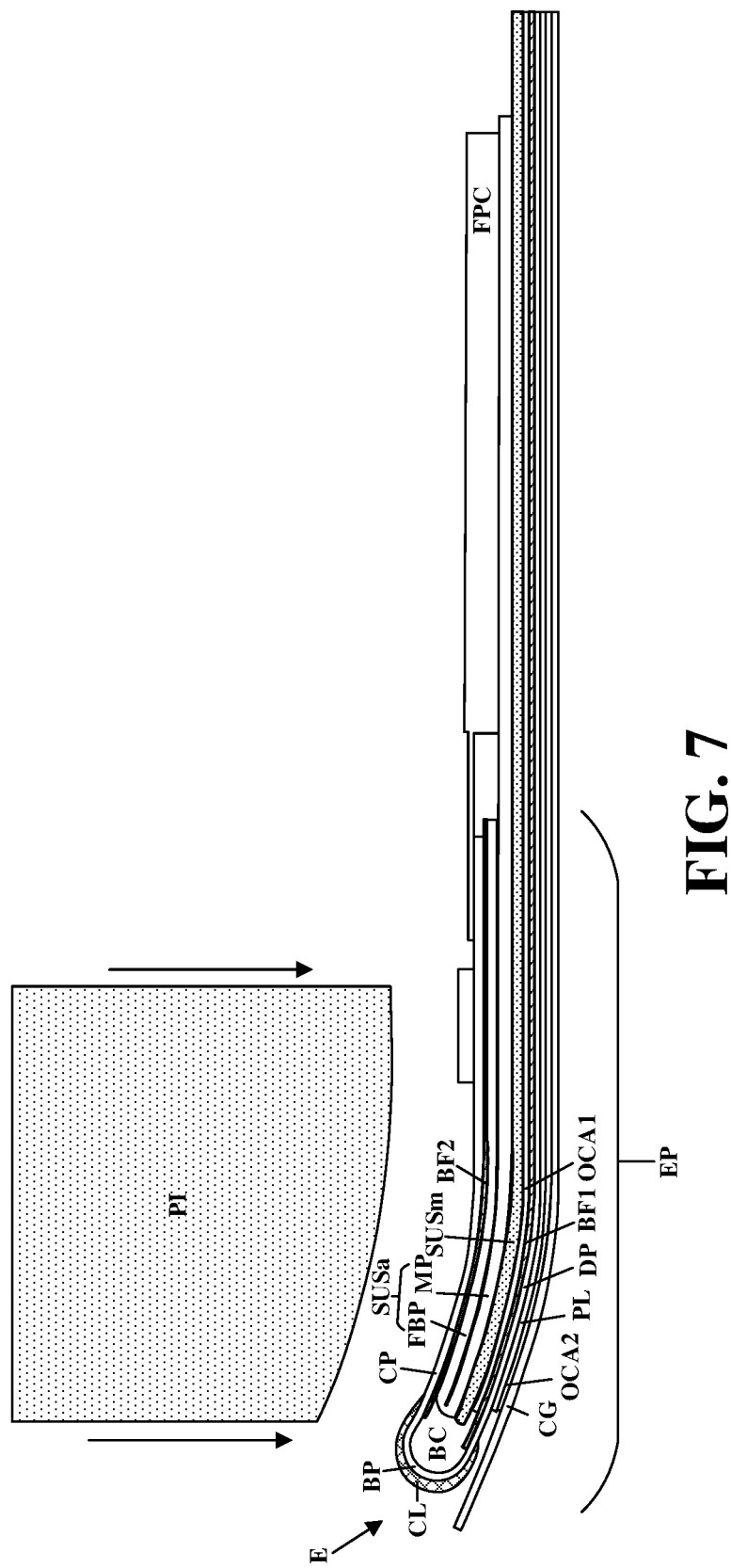
FIG. 7 illustrates a process of curving an edge portion of the display apparatus using a profile indenter in some embodiments according to the present disclosure.

In some embodiments, the method further includes curving the layers of the stacked structure comprises pressing the edge portion of the display apparatus using a profile indenter. FIG. 7 illustrates a process of curving an edge portion of the display apparatus using a profile indenter in some embodiments according to the present disclosure.

Various appropriate materials and various appropriate fabricating methods may be used to make the first back film and the second back film. For example, a flexible organic polymer material may be used to form the first back film and the second back film. Examples of appropriate flexible organic polymer materials include, but are not limited to, polyimide, polycarbonate, polyethersulfone, polyethylene terephthalate, polyethylene naphthalate, polyarylate, and fiber-reinforced plastic.

Various appropriate materials and various appropriate fabricating methods may be used to make the coating layer. For example, a UV curable adhesive material may be used to form the coating layer. Examples of UV curable adhesives include UV curable adhesive materials that contain a free radical generating photoinitiator and a compound having multiple unsaturated groups (e.g., acrylate, methacrylate or vinyl groups), such as an oligomer having multiple unsaturated groups and, optionally, a monomer having multiple unsaturated groups. Specific examples of free radical generating photoinitiators include, for example, type I or type II photoinitiators, such as benzoin ether, 1-hydroxy-cyclohexylphenyl-ketone or benzophenone, among others. Specific examples of oligomers having multiple unsaturated groups include acrylate oligomers such as epoxy acrylates (e.g., bisphenol-A-epoxy acrylate), aliphatic urethane acrylates (e.g., IPDI-based aliphatic urethane acrylates), aromatic urethane acrylates, polyether acrylates, polyester acrylates, aminated acrylates, and acrylic acrylates. Specific examples of monomers include mono- di- and tri-functional monomers such as trimethylolpropane triacrylate, propoxylated trimethylolpropane triacrylate, ethoxylated trimethylolpropane triacrylate, tripropylene glycol diacrylate, hexanediol diacrylate, isobornyl acrylate, isodecyl acrylate, ethoxylated phenyl acrylate, and 2-phenoxyethyl acrylate, among others. Further examples of UV curable adhesives include UV curable adhesive materials that comprise a cationic photoinitiator and an epoxide compound. Particular examples of cationic photoinitiators include onium salts such as aryl sulfonium and aryl iodonium salts. Specific examples of epoxide compounds include cycloaliphatic epoxide compounds and aromatic epoxide compounds such as 3,4-epoxy-cyclohexylmethyl-3,4-epoxy-cyclohexane-carboxylate and Bisphenol A diglycidyl ether, and polysiloxanes having epoxy groups, among others.

Various appropriate materials and various appropriate fabricating methods may be used to make the optically clear adhesive layer. Examples of appropriate optically clear adhesive materials include, but are not limited to, poly-acrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the cover. Examples of appropriate materials for making the cover include, but are not limited to, polyamine such as colorless polyamine, thin glass, ultrathin glass, polyethylene terephthalate, polyacrylate, polymethylmethacrylate, polycarbonate, polyethylene naphthalate, polyvinylidene chloride, polyvinylidene difluoride, polystyrene, an ethylene vinyl alcohol copolymer, and/or a combination thereof. Optionally, the cover has a double-layer structure including a first sub-layer, a second sub-layer, and an adhesive sub-layer adhering the first sub-layer and the second sub-layer together. Optionally, the first sub-layer and the second sub-layer are made of a colorless polyamine, and the adhesive sub-layer is an optically clear adhesive sub-layer. Optionally, the cover further includes a hard coating sub-layer. Optionally, the cover further includes a protective film.

Various appropriate materials and various appropriate fabricating methods may be used to make the main support layer. Optionally, the main support layer includes a metal support layer. Various appropriate materials and various appropriate fabricating methods may be used to make the metal support layer. For example, a metallic material may be used to form the metal support layer. Examples of appropriate metallic materials include, but are not limited to, aluminum, copper, stainless steel, and various appropriate alloys or laminates. Optionally, the main support layer includes an organic material layer (e.g., a foam layer). For example, an organic polymer material may be used to form the organic material layer (e.g., the foam layer). Examples of appropriate organic polymer materials include, but are not limited to, polyethylene terephthalate.

Various appropriate materials and various appropriate fabricating methods may be used to make the auxiliary support layer. Optionally, the auxiliary support layer includes a metal support layer. Various appropriate materials and various appropriate fabricating methods may be used to make the metal support layer. For example, a metallic material may be used to form the metal support layer. Examples of appropriate metallic materials include, but are not limited to, aluminum, copper, stainless steel, and various appropriate alloys or laminates. Optionally, the auxiliary support layer includes an organic material layer (e.g., a foam layer). For example, an organic polymer material may be used to form the organic material layer (e.g., the foam layer). Examples of appropriate organic polymer materials include, but are not limited to, polyethylene terephthalate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
   a display panel having a display portion, a connecting portion, and a bending portion, wherein the bending portion connects the display portion and the connecting portion, the bending portion is bent;
   a main support layer; and
   an auxiliary support layer comprising a main portion and a folded-back portion connected to the main portion as a unitary structure;
   wherein an edge portion of the display apparatus comprises a stacked structure, the stacked structure comprising:
   the connecting portion;
   the folded-back portion on the connecting portion;
   at least a part of the main portion on a side of the folded-back portion away from the connecting portion;
   a part of the main support layer; and
   a part of the display portion on a side of the part of the main support layer away from the main portion;

wherein layers of the stacked structure is curved toward a back side of the display apparatus, the back side of the display apparatus being opposite to a light emitting side of the display apparatus;

wherein the stacked structure further comprises:
a first back film covering a back surface of the display portion, the first back film being between the display portion and the part of the main support layer; and
a second back film covering a back surface of the connecting portion, the second back film being between the connecting portion and the folded-back portion;
wherein the bending portion is absent of the first back film and absent of the second back film.

2. The display apparatus of claim 1, wherein the folded-back portion and the main portion comprise a same material; the folded-back portion and a portion of the main portion form a double layer structure; and
the folded-back portion is at least partially in contact with a back surface of the main portion, the back surface being a surface of the main portion on a side away from the main support layer.

3. The display apparatus of claim 2, wherein the bending portion is bent to form a bending cavity; and
a portion of the auxiliary support layer where the folded-back portion and the main portion connected to each other is directly adjacent to the bending cavity.

4. The display apparatus of claim 3, further comprising a coating layer covering a back side of the bending portion opposite to a side directly surrounding the bending cavity.

5. The display apparatus of claim 2, wherein at least portions of the folded-back portion and the main portion have matching curvatures.

6. The display apparatus of claim 5, wherein at least portions of the folded-back portion, the main portion, and the main support layer have matching curvatures.

7. The display apparatus of claim 1, wherein a respective layer of the layers of the stacked structure and an adjacent layer have matching curvatures.

8. The display apparatus of claim 1, further comprising a flexible printed circuit bonded to the connecting portion;
wherein the flexible printed circuit comprises a chip portion on a back side of the display apparatus, a bonding portion comprising a plurality of bonding pads that are bonded to the connecting portion, and an extension portion connecting the chip portion and the bonding portion; and
a first average distance between a surface of the bonding portion on a side closer to the main support layer and a surface of the main support layer on a side closer to the bonding portion is substantially same as a second average distance between a surface of the extension portion on a side closer to the main support layer and a surface of the main support layer on a side closer to the extension portion.

9. The display apparatus of claim 8, wherein the surface of the bonding portion on a side closer to the main support layer and the surface of the extension portion on a side closer to the main support layer are substantially co-planar.

10. The display apparatus of claim 1, wherein an orthographic projection of the folded-back portion on the second back film is non-overlapping with a portion of the second back film that extends toward the bending portion beyond a portion of the auxiliary support layer where the folded-back portion and the main portion connected to each other; and
an edge of the portion of the second back film is spaced apart from the portion of the auxiliary support layer where the folded-back portion and the main portion connected to each other by a distance equal to or greater than 0.15 mm.

11. The display apparatus of claim 1, wherein the stacked structure further comprises:
a first optically clear adhesive layer between the first back film and the part of the main support layer, the first optically clear adhesive layer adhering the first back film and the main support layer together;
a polarizer on a side of the display portion away from the first back film;
a second optically clear adhesive layer on a side of the polarizer away from the display portion; and
a cover on a side of the second optically clear adhesive layer away from the polarizer.

12. The display apparatus of claim 1, wherein the main support layer comprises a metallic material; and
the auxiliary support layer comprises an organic polymer material.

13. The display apparatus of claim 1, wherein the main support layer comprises a metallic material; and
the auxiliary support layer comprises a metallic material.

14. A display apparatus, comprising:
a display panel having a display portion, a connecting portion, and a bending portion, wherein the bending portion connects the display portion and the connecting portion, the bending portion is bent;
a main support layer;
an auxiliary support layer comprising a main portion and a folded-back portion connected to the main portion as a unitary structure; and
a flexible printed circuit bonded to the connecting portion;
wherein an edge portion of the display apparatus comprises a stacked structure, the stacked structure comprising:
the connecting portion;
the folded-back portion on the connecting portion;
at least a part of the main portion on a side of the folded-back portion away from the connecting portion;
a part of the main support layer; and
a part of the display portion on a side of the part of the main support layer away from the main portion;
wherein layers of the stacked structure is curved toward a back side of the display apparatus, the back side of the display apparatus being opposite to a light emitting side of the display apparatus;
the flexible printed circuit comprises a chip portion on a back side of the display apparatus, a bonding portion comprising a plurality of bonding pads that are bonded to the connecting portion, and an extension portion connecting the chip portion and the bonding portion; and
a first average distance between a surface of the bonding portion on a side closer to the main support layer and a surface of the main support layer on a side closer to the bonding portion is substantially same as a second average distance between a surface of the extension portion on a side closer to the main support layer and a surface of the main support layer on a side closer to the extension portion;
wherein an orthographic projection of an edge of the folded-back portion closer to the chip portion on the main support layer is spaced apart from an orthographic projection of an edge of the connecting portion closer to the chip portion on the main support layer by a distance equal to or greater than 0.2 mm;

the orthographic projection of the edge of the connecting portion closer to the chip portion on the main support layer is spaced apart from an orthographic projection of an edge of the chip portion closer to the folded-back portion on the main support layer is spaced apart by a distance less than 1.0 mm; and the orthographic projection of the edge of the folded-back portion closer to the chip portion on the main support layer is between the orthographic projection of the edge of the connecting portion closer to the chip portion on the main support layer and the orthographic projection of the edge of the chip portion closer to the folded-back portion on the main support layer.

15. A method of fabricating a display apparatus, comprising:

providing a display panel;

bending the display panel thereby forming a bending portion, a display portion, and a connecting portion, the bending portion connecting the display portion and the connecting portion;

providing a main support layer;

providing an auxiliary support layer comprising a main portion and a folded-back portion connected to the main portion as a unitary structure;

disposing the main support layer and the auxiliary support layer between the connecting portion and the display portion, thereby forming a stacked structure in an edge portion of the display apparatus, wherein the stacked structure comprising the connecting portion; the folded-back portion on the connecting portion; at least a part of the main portion on a side of the folded-back portion away from the connecting portion; the main support layer on a side of the main portion away from the folded-back portion; and a part of the display portion on a side of the main support layer away from the main portion; and curving layers of the stacked structure toward a back side of the display apparatus, the back side of the display apparatus being opposite to a light emitting side of the display apparatus;

wherein the stacked structure further comprises:

a first back film covering a back surface of the display portion, the first back film being between the display portion and the part of the main support layer; and a second back film covering a back surface of the connecting portion, the second back film being between the connecting portion and the folded-back portion;

wherein the bending portion is absent of the first back film and absent of the second back film.

16. The method of claim 15, further comprising:

providing a proto-support layer;

folding the proto-support layer to form the folded-back portion and the main portion, the folded-back portion and a portion of the main portion forming a double layer structure; and pressing at least the double layer structure to achieve a curvature matching with a curvature of the main support layer.

17. The method of claim 15, wherein curving the layers of the stacked structure comprises pressing the edge portion of the display apparatus using a profile indenter.

* * * * *